US005621529A

United States Patent [19]
Gordon et al.

[11] Patent Number: 5,621,529
[45] Date of Patent: Apr. 15, 1997

[54] APPARATUS AND METHOD FOR PROJECTING LASER PATTERN WITH REDUCED SPECKLE NOISE

[75] Inventors: Steven J. Gordon, Weston; Faycal E. K. Benayad-Cherif, Cambridge, both of Mass.

[73] Assignee: Intelligent Automation Systems, Inc., Cambridge, Mass.

[21] Appl. No.: 418,142

[22] Filed: Apr. 5, 1995

[51] Int. Cl.$^6$ .................................................. G01B 11/24
[52] U.S. Cl. ........................................ 356/376; 250/237 G
[58] Field of Search .......................... 356/376, 371, 356/354; 250/237 G

[56] References Cited

U.S. PATENT DOCUMENTS

| | | | |
|---|---|---|---|
| 3,650,608 | 3/1972 | Baker | 350/320 |
| 4,011,403 | 3/1977 | Epstein et al. | 358/209 |
| 4,155,630 | 5/1979 | Ih | 350/188 |
| 4,619,508 | 10/1986 | Shibuya | 353/122 |
| 4,742,237 | 5/1988 | Ozawa | 356/376 |
| 4,819,033 | 4/1989 | Yoshitake | 355/53 |
| 4,851,978 | 7/1989 | Ichihara | 362/268 |
| 4,970,546 | 11/1990 | Suzuki et al. | 355/53 |
| 5,048,926 | 9/1991 | Tanimoto | 359/487 |
| 5,161,045 | 11/1992 | Hutchin | 359/197 |
| 5,253,110 | 10/1993 | Ichihara | 359/619 |
| 5,307,207 | 4/1994 | Ichihara | 359/622 |

*Primary Examiner*—Frank Gonzalez
*Assistant Examiner*—Amanda Merlino
*Attorney, Agent, or Firm*—Steven J. Weissburg

[57] ABSTRACT

An illuminating apparatus is for use with a visual sensory apparatus, for projecting a light pattern onto a surface to be viewed by the sensory apparatus. The illuminating apparatus comprises: a light source; a patterniser for constraining light emitted from the source to produce on the surface, a light pattern having a light interface, the interface having an extended dimension. The light pattern is caused to move relative to the surface, parallel to the extended dimension of the light interface. The pattern may comprise a plurality of extended straight line interfaces, each interface being parallel to the other interfaces of the plurality. Rather than straight, the plurality may be circular and concentric. Rather than a plurality, the pattern may comprise a single straight line or circular light interface. The motion of the light pattern relative to the surface minimizes any speckle pattern that might arise from optical interference, below the degree of speckle that would be presence if the pattern were not moving. The pattern may be made to move by moving the light source, or a mirror or prism interposed in the optical path from the light source to the surface.

33 Claims, 3 Drawing Sheets

PROJECTED
3D POINT

LEFT
IMAGE

RIGHT
IMAGE

APPARATUS AND METHOD FOR PROJECTING LASER PATTERN WITH REDUCED SPECKLE NOISE

BACKGROUND

The present invention relates generally to the field of laser illumination. It relates more specifically to using laser light to mark locations, such as may be practiced in connection with machine vision systems.

Laser light markers are used in a wide variety of industrial applications. Such applications include: imaging deblurring, pattern recognition, matched filter imaging processing, half-tone dot or line removal, active optical feedback image processing, optical holography and exposure of photolithographic patterns in semiconductor device manufacture, optical alignment and three dimensional sensing.

For instance, U.S. patent application Ser. No. 505,722, filed on Apr. 5, 1990, in the name of Steven J. Gordon, entitled REAL TIME THREE DIMENSIONAL SENSING SYSTEM and co-assigned with the present invention, and the corresponding published PCT application PCT/US91/02055, published on Oct. 17, 1991, describes a machine vision apparatus that uses a projected laser pattern. The '722 patent application and the PCT publication are incorporated fully herein by reference, illustrated generally in FIGS. 1 and 2. Two cameras (a nominally left camera and right camera) receive and record visual information with respect to a three dimensional object of which spatial information is desired. The object is illuminated by one or more coherent monochromatic laser light sources, which generate a plurality of simultaneous, spaced planes of light. The number of planes depends on the desired resolution, size of the object, and computational capacity of the data processing equipment. Each camera simultaneously records a still video image of the light reflected from the sensed object during the sampling period of the camera image capture device. Each image recorded is the pattern of light created by the reflection of the incident light planes off of the sensed object as seen from the position of each respective camera. The pixels of the video picture are converted into digital signal information and stored in computer memory.

After the video images are acquired and converted to digital signal information, each of the two images is processed, independently at first. First, for each image separately, signal processing is applied to the digital information to collect individual pixels into groups, each group comprising contiguous pixels in the image (hereinafter stripes). Signals representing the two video images are now combined to determine the coordinate location in three dimensional space of any illuminated point of the sensed object.

First, a single pixel of each stripe in one of the video images (e.g. the right) is selected (hereinafter the selected pixel). Given that the position of the camera lens in space is known and the selected pixel is known, then it is known that the point corresponding to the selected pixel (hereinafter the selected point) lies on a known line drawn from the lens center out into space. This line (which appears as a point in the right image), appears as a line in the left image. This line is called the "epi-polar" line of the selected point in the right image. Since the position of the lens center of the left camera also is known, this epi-polar line can be calculated and drawn in the left image. The epi-polar line, when drawn in the left image, will intersect at least one, and most likely several, of the stripes of the left video image. It is known that one of the pixels where the epi-polar line and a stripe intersect (hereinafter intersection pixels) represents the selected point from the right image. The actual coordinate location in space of the point corresponding to any of these intersection pixels (hereinafter intersection points) is determinable by triangulation. Since the position in space of each plane of light which created the stripes is also known, the single point of all the intersection points which corresponds to the selected point in the right image is ascertained by determining the three dimensional coordinate of each intersection point to determine if it lies in one of the known planes of light. The intersection point which lies closest to a known plane of light is taken as the selected point.

This process is repeated for at least one point in every stripe in the right image. Every stripe in the right image does not necessarily have a matching stripe in the left image. It is possible that stripes that appear in the right image, particularly stripes near the edges, will not appear in the left image. Most, if not all, stripes in the right image are matched to stripes in the left image by this process and the three dimensional coordinates of at least one point of each stripe is determined. With this knowledge and the knowledge that every other point in any given stripe lies in the corresponding light plane, the three dimensional coordinates of any other point in the group can be determined by triangulation. Thus, the coordinate location of any illuminated point on the sensed object can be determined.

This information can then be processed and used for a wide variety of industrial and military applications.

A problem that often arises in connection with laser illuminated apparatus is known as "speckle." If the characteristic dimension of the surface roughness of the object upon which the laser impinges is on the order of the laser light wavelength, a speckled pattern of relatively dark and bright spots arises. The speckle pattern is due to the interaction of constructive interference among the components of light that produces the bright spots, and destructive interference that produces the dark spots. In particular, the degree of speckle and the locations of the speckle is directly related to the angle of incidence between the illuminating light beam and the surface. The surface roughness contributes to the angle of incidence.

Speckles create problems, particularly for the machine vision apparatus described above. For that apparatus, it is important to be able to determine the pixel upon which the reflection, from the surface of the object to be imaged, of the interface between a light plane and the darkness adjacent the light plane, falls. If the portion of the reflection that falls on any given pixel is a speckle (either a dark or a light one), it is difficult to determine whether that location is part of the light plane or the darkness.

Methods are known for reducing the effect of speckle, but they are not suitable for use with a projected laser pattern. For instance, some methods require defocusing the optics or opening the aperture. For the apparatus described above, it is important to have narrowly focused strips over a large depth of field, which precludes the use of these methods.

One method for speckle reduction, used in connection with a different type of apparatus, is applied to diffused laser light to produce a uniform area of illumination. The light is initially diffused. The diffused light is reflected from a mirror that is vibrating, so that the reflected, diffused laser beam is projected to form a pattern. This pattern is projected through a second diffuser (not the ultimate surface to be illuminated) and is again diffused. It is then collimated onto an image plane. The patent asserts that the speckling is eliminated, because some degree of random spatial phase modulation is produced.

This method of eliminating speckle would not work with the machine vision apparatus described above, because either of the diffusion elements would destroy the initially projected pattern, which is required to be projected on the item to be imaged for the machine vision apparatus to operate.

Another known method of minimizing speckle in a photolithographic illumination application entails irradiating a single laser pulse onto an object and using a scanning mirror and a fly-eye lens to create a uniform, coherent illumination. The speckle pattern produced is moved in at least one direction. The object of this device is to generate a uniform pattern illumination field. This method cannot be used with the machine vision apparatus, because it requires "structured light" which has identifiable geometric pattern throughout the scene. Uniform illumination does not provide such a pattern.

SUMMARY

An embodiment of the apparatus of the invention comprises a monochromatic light source, such as a laser, and a patterniser for generating a pattern of projected laser light onto a surface. Typical patterns are parallel stripes of narrow bands of light and dark. The apparatus also includes a means for causing the projected pattern to move relative to the surface, parallel to the parallel stripes of the pattern. Thus, the pattern that is projected with the moving apparatus engaged is elongated relative to a pattern that would be projected with the moving apparatus disengaged. The resultant speckle-type interference in the projected pattern is reduced from that normally present in patterns of projected monochromatic, coherent light.

According to a preferred embodiment, the invention is an illuminating apparatus for use with a visual sensory apparatus, for projecting a light pattern onto a surface to be viewed by the sensory apparatus, the surface having a characteristic roughness. The illuminating apparatus comprises: a light source; means for constraining light emitted from the source to produce on the surface, a light pattern having a light interface, the interface having an extended dimension; and means for causing the light pattern to move relative to the surface, parallel to the extended dimension of the light interface.

According to another preferred embodiment, the light pattern comprises a plurality of extended straight line interfaces, each interface being parallel to the other interfaces of the plurality.

For one preferred embodiment of the invention, there is apparatus for moving the light source parallel to the plurality of straight line interfaces.

According to another preferred embodiment, the light interfaces are circular, rather than being straight lines.

According to another preferred embodiment, the light pattern consists of exactly one extended interface. The extended interface can be either a straight line or a circle.

According to yet another preferred embodiment, the apparatus includes a moving mirror, located and constrained to move such that light projected onto the mirror is reflected onto the surface and the light pattern moves across the surface parallel to the plurality of parallel straight line interfaces. The mirror may rotate fully about an axis, or it may reciprocate.

According to still another embodiment of the invention, rather than a moving mirror, the apparatus includes a moving prism, through which light is refracted onto the surface. The prism may rotate fully about an axis, or it may reciprocate.

According to yet another embodiment, the invention is an apparatus for registering the configuration of a surface extending over a portion of a viewing field, the surface having a characteristic roughness, the apparatus comprising: means for projecting a light pattern onto the surface, the projection means itself comprising: a light source; means for constraining light emitted from the source to produce, on the surface, a light pattern having a plurality of light interfaces spaced from each other, the light interfaces being extended and parallel to each other; and means for causing the light pattern to move relative to the surface, parallel to the extended dimension of the lighted interfaces. The registering apparatus further comprises a visual sensory apparatus that views said projected pattern of light interfaces, said sensory apparatus having a characteristic exposure interval and being located so that said projected pattern is visible to said sensory apparatus.

The embodiment of the invention that is a complete apparatus for registering the configuration of a surface may also include the additional embodiments of the means for projecting a light pattern, discussed above.

According to another embodiment, the invention is a method for projecting a light interface pattern onto a surface having a characteristic roughness, said method comprising: projecting a light interface pattern onto said surface, said pattern comprising a light interface having an extended dimension; and causing said light interface pattern to move, relative to said surface, parallel to said extended dimension.

According to another embodiment of the method, the light interface pattern may comprise a plurality of light interfaces, each interface having an extended dimension that is parallel to the extended dimension of each of the other interfaces. The light interface pattern may comprise a plurality of straight line interfaces.

According to another embodiment of the method of the invention, the light interface pattern may comprise a plurality of light interfaces, each interface having an extended dimension that is concentric with the extended dimensions of each of the other interfaces. The light interface pattern may comprise a plurality of circular interfaces.

According to still another embodiment, the method of the invention further comprises the step of causing the pattern to move through a distance during a characteristic exposure interval of a machine vision apparatus for use with the projecting method such that interference speckle is reduced as compared to the speckle that would arise without motion of the pattern relative to the surface. The light source can be moved. Alternatively, the light may be projected onto a moving mirror or prism, that directs the light pattern to the surface.

BRIEF DESCRIPTION OF THE DRAWINGS

These and other features, aspects, and advantages of the present invention will become better understood with regard to the following description, appended claims and accompanying drawings, where:

DETAILED DESCRIPTION

Figure 3:
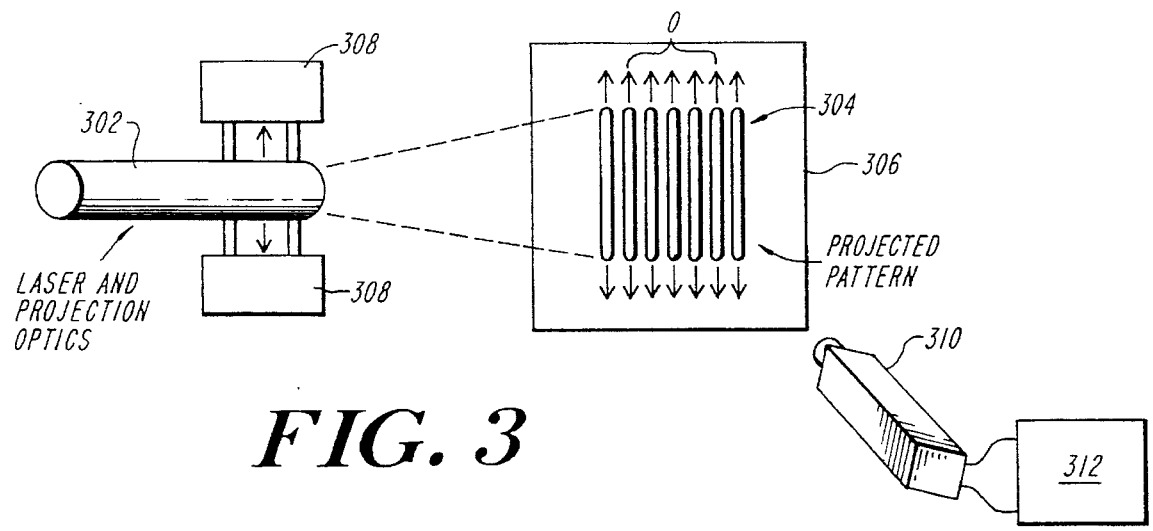
FIG. 3 shows schematically one embodiment of an apparatus of the invention, which projects a pattern of parallel bars, which apparatus oscillates in a direction parallel to the long dimension of the bars.

A preferred embodiment of the invention is shown schematically in FIG. 3. A laser unit 302 projects a pattern of coherent, monochromatic light onto a field 306, upon which an object to be imaged (not shown) would be supported. The laser unit includes means (not shown) such as a mask or a cylindrical lens (to expand the spot beam vertically into a fan) followed by a diffraction grating, binary optics, a set of beam splitters, etc., (to duplicate the fan horizontally) to form the pattern of light projected as desired, in this case, a pattern of parallel, straight bars. For a preferred embodiment of the invention, the wavelength of the light is 680 nm, in the near infra red range. However, the invention is applicable over a wide spectrum, including visible and invisible (to the human eye) light between a range at least as large as from 300 nm to 1300 nm. The word "light" is used herein and in the claims appended hereto to mean this broad range of visible and invisible radiation that can be used for machine "vision." In general, a more powerful laser can be strobed more quickly, and can cover a relatively larger area than a less powerful one while maintaining the same lumination level.

An oscillating apparatus 308 is provided, connected to a part of the laser unit 302, such that the light projected by the laser unit oscillates in its scan pattern, moving first in one direction, and then in the opposite direction, as indicated by the arrows O aligned with the bars of the pattern 304. Suitable oscillating apparatus include piezoelectric actuators, electric motors, galvanometers, voice coils, etc. The oscillating apparatus can be made to oscillate the entire laser unit 302, an output lens only, or a prism or mirror.

Figure 1:
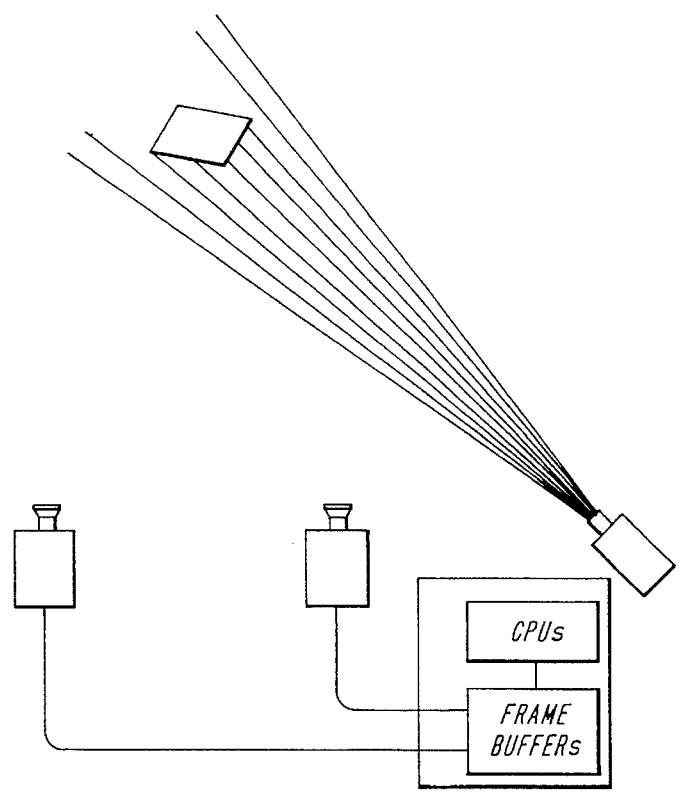
FIG. 1 is a pictorial view of a prior art three dimensional sensing system with which the present invention can be used.
Figure 2:
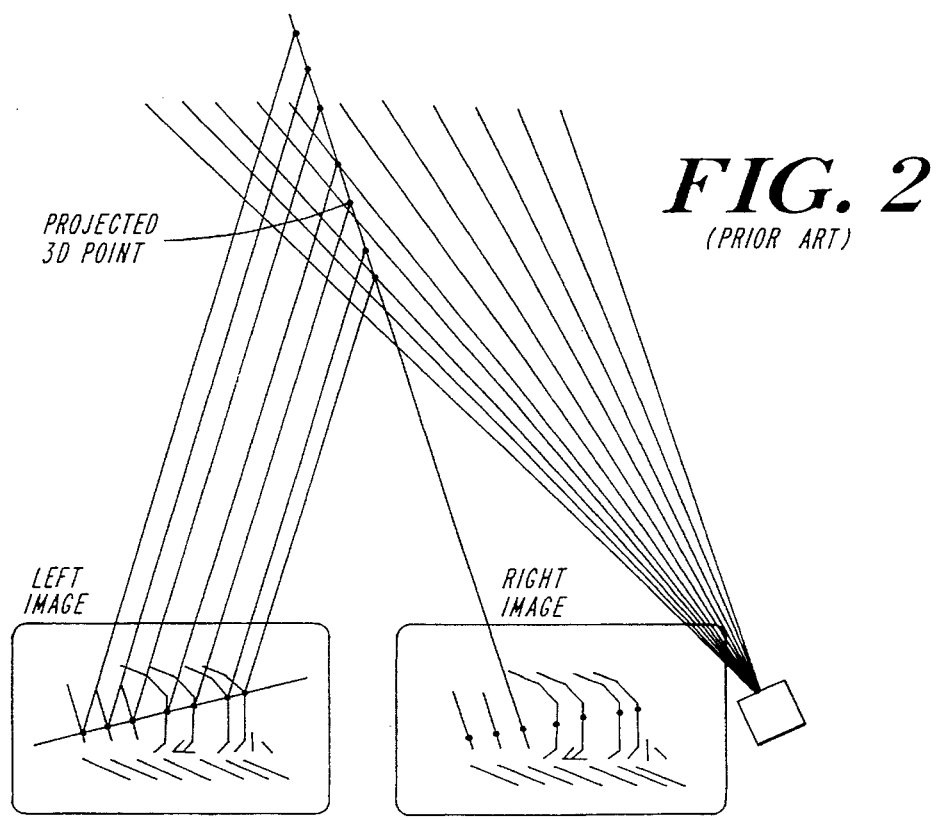
FIG. 2 is a pictorial representation of recorded video images superimposed on a pictorial representation of light planes of the prior art three dimensional sensing system shown in FIG. 1, which produced the video images.

The result is that the pattern oscillates in the directions of the arrows O. The oscillating pattern is reflected into the optical system of the camera 310, which is part of a machine vision system such as shown in FIG. 1, also including signal processing equipment 312. The camera has a characteristic exposure interval, such that all of the light reflected from any given spot over the time period corresponding to the exposure interval is captured by the image capture device of the camera (such as a CCD). The exposure interval for a video standard capture device is on the order of 1/60 sec., although other periods are possible. For instance, a commercial device has a variable exposure interval from 1/60 sec. to 1/10,000 sec. Thus, the image capture device averages all of the light amplitudes reflected over that interval. In general, an image capture device sampling cycle is characterized by a maximum rate at which it can output a signal that corresponds to the light captured during the exposure interval. During the time between the close of the exposure interval and the transmission of the signal, no image is captured. This non-sampling time could be considered to be a "blind" interval, during which no light is captured. The maximum output speed for a typical image capture device is generally on the order of 1/30 sec.

The pattern is caused to oscillate such that the reflected pattern is moving during a significant portion of each exposure interval.

It is believed that the apparatus achieves its goals for the following reasons. At each moment, the light pattern suffers from a field of speckles, which is undesirable. However, this speckle field, which is generally random in its spatial distribution, changes over time due to the oscillation of the gross light pattern caused by the moving apparatus. At one moment, a dark spot will be at a certain location. At the next moment, due to the change in angle of incidence between the illuminating beam and the surface, a bright spot will be at the same location. Both moments occur within one sampling interval. The image capture device captures both the light and the dark moment, averaging them together, to produce a semi-bright spot. This occurs throughout the gross pattern. Thus, the image capture device captures an entire pattern, of relatively uniform, lighted bars, alternating with dark spaces. The intensity of the bars is less than would be the intensity of lighted regions if no motion had been applied.

Thus, the important parameters are the exposure interval and the relative distance over the surface swept out by one point of the projected pattern during the exposure interval. (Alternatively, this latter concept can be thought of as the change in the angle of incidence between a ray of the light and the surface, for a single locus of the surface, during on exposure interval.) For instance, in one embodiment, the moving apparatus may cause a locus of a point of the pattern to move a distance x in a single direction during one exposure interval. Another embodiment might cause the locus to move in an oscillating fashion through 10 cycles, each over a distance of x/10 (for a full cycle) during the exposure interval. The degree to which the speckle would be reduced would be on the same order for both embodiments. Each would reduce the speckle to a greater degree than an embodiment where the full distance the locus of the pattern traveled was only x/10.

The degree to which the speckle is actually reduced depends on other parameters as well, including the surface roughness, the angle of incidence between the surface and the ray of light that produces the pattern, etc. Generally speaking, if the pattern is oscillated, it is beneficial that its period of oscillation be equal to or shorter than the sampling interval. Combinations of sampling interval and pattern motion that result in a greater relative motion between a locus of the pattern and the surface during a sampling interval generally result in a more severe reduction in the unwanted speckle.

The entire pattern is generally elongated in the direction of oscillation. Such elongation is not a problem, because the imaging apparatus, as described in the U.S. patent application Ser. No. 505,722, identified above, bases its location and patterning operations, on the distance between interfaces of light and dark (referred to below as "light interfaces"), and the correlation between the light interfaces and locations on the object. Thus, the length of the bars is irrelevant, and changes in their lengths do not affect the imaging operation.

During each exposure interval of the image capture device, the moving image should move over some distance (either all in the same direction, or back and forth). Generally, the larger the distance, the more the speckle pattern will be reduced. However, the larger the distance, the more the intensity of the lighted regions will be reduced. Thus, the operator must choose that degree of motion that provides both acceptable speckle and acceptable illumination. To overcome the intensity reduction, a more powerful laser can be used.

Figure 4:
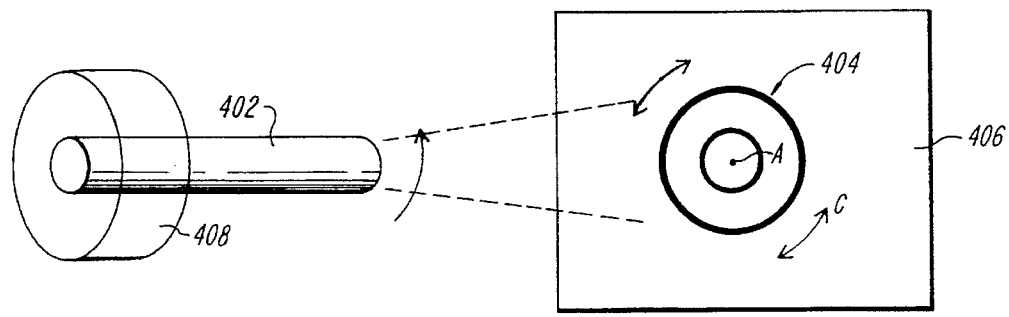
FIG. 4 shows schematically another embodiment of an apparatus of the invention, which projects a pattern of concentric circles, which apparatus oscillates in a rotation around an axis parallel with the concentric axes of the circles.

Another embodiment that accomplishes the same effect is shown schematically in FIG. 4. (The camera and associated signal processing instruments are not shown, however, they would be arranged in the same manner as shown in FIG. 3) A laser and projection optics 402 projects a pattern 404 onto a field 406 where an object will be supported. In this case, the pattern projected is of concentric light and dark circles. A motor 408 is fixed to the laser so that the projected image of laser light rotates as indicated by the arrows C, around the point A, through which runs an axis that is the axis for all of the circles of the pattern 404. The rotation can be continuous, in the same direction, or it can oscillate back and forth. The same considerations of exposure interval and degree of motion of the light source discussed above, apply. In general, the faster the pattern sweeps over the surface the more the speckle problem will be reduced.

Figure 5:
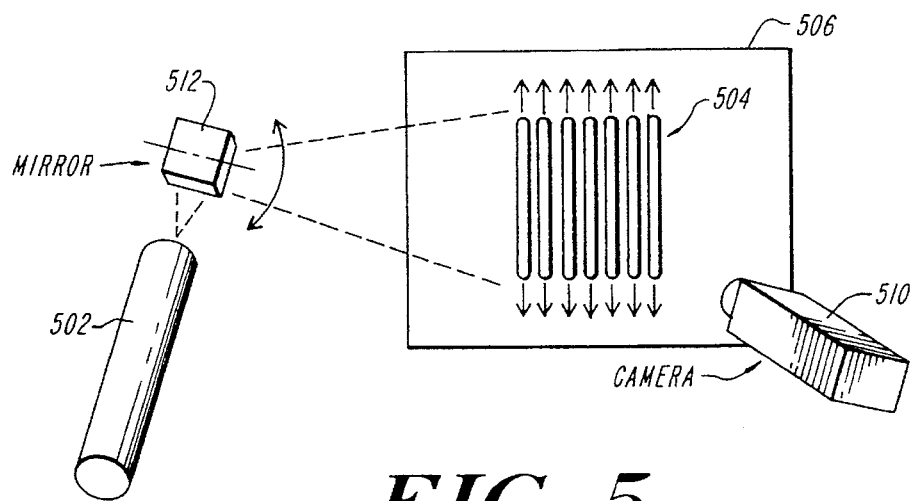
FIG. 5 shows schematically an embodiment of the invention, where the pattern is caused to oscillate by an oscillating mirror.

Translation or rotation of the projected pattern may be accomplished by directly moving the source, as shown in FIGS. 4 and 5. It may also be caused by reflecting the projected pattern from a moving mirror, or through a moving prism, or with a variety of other optical, electro-optic or opto-mechanical techniques.

For instance, as shown in FIG. 5, a stationary laser equipped with projection optics 502 projects a pattern at a mirror 512, which reflects the light to be displayed as a pattern 504 on a field 506 upon which an object is supported. A camera 510 captures an image of the projected pattern, as above.

The mirror 512 is connected to apparatus that moves the mirror, so that the pattern oscillates as desired. For instance, the mirror can spin fully around an axis, continuously in the same direction. Alternatively the mirror can oscillate back and forth through a fraction of a cycle. In a preferred embodiment, a mirror is oscillated through ±5–10 deg. Such oscillation was achieved using a galvanometer, available from General Scanning, of Watertown Mass.

Generally speaking, from a despeckling standpoint, the larger the oscillation, the better. Similarly, the faster the oscillation, the better. This is true for all of the embodiments, whether the laser apparatus moves or a mirror is used.

The invention works with any imaging device that uses a pattern of alternating light and dark regions, which can tolerate motion of the pattern in a controlled fashion. For the instrumentation discussed above, the number of different light interfaces is determined by the desired resolution of the depth of the object being imaged; the higher the desired resolution, the more light interfaces. The primary mode of operation of such a device notes the relative locations of the light interfaces, rather than the distance between two regions of either light or dark. Thus, the apparatus can work (with relatively low resolution) with a single interface; only one light region, adjacent to a region of darkness. The present invention will also work with a single projected line (or circle) and a more involved "pattern" is not required.

In a typical light pattern projection situation, the interface" between dark and lighted regions is to some degree, a spectrum or gradient of changing intensities rather than an abrupt, step function type of transition. Further, the "dark" region is not absolutely light-free. Thus, as used herein, an "interface" between a light and dark region means variation in light intensity that a relevant apparatus perceives as an interface between a relatively lighter and relatively darker region. The intensity pattern from light to dark to light, etc., may even be sinusoidal, such as is used by fringe interferometers.

Figure 6:
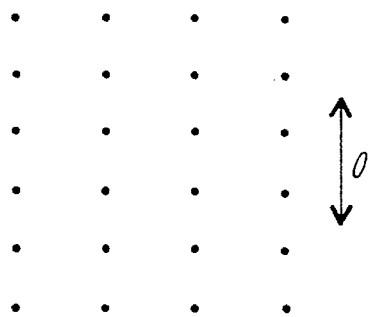
FIG. 6 shows schematically a pattern of discontinuous light spots which, if moved in the direction indicated by the arrows, will generate an illuminated pattern of continuous bars, as shown in FIGS. 3 and 5.

The invention does not require that the projected pattern of light be continuous when the apparatus is stationary. For instance, the pattern of dots shown in FIG. 6 is suitable, since as the apparatus moves, the projected pattern will sweep over an area of the target-field, in the direction of the arrow O, The pattern will appear to be continuous, such as shown in FIG. 3. The pattern must move such that a light spot moves at least as far as the original position of the adjacent spot during one exposure interval of the image capture device.

Figure 7:
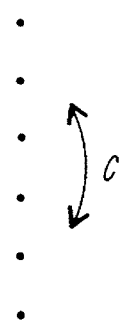
FIG. 7 shows schematically a pattern of discontinuous light spots which, if moved in the direction indicated by the arrows, will generate an illuminated pattern of concentric circles, as shown in FIG. 4.

As shown in FIG. 7, a discontinuous pattern of dots can also be used to create a circular pattern, such as is shown in FIG. 4, if the pattern is rotated at a suitable speed in the direction of the arrow C.

Figure 8:
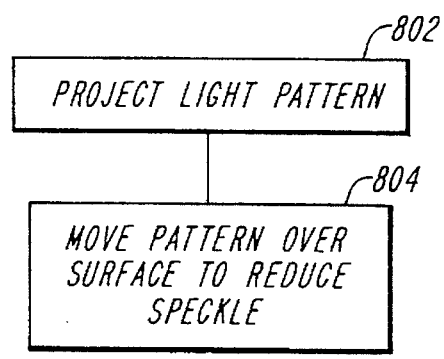
FIG. 8 shows schematically a method of the invention.

The invention also includes as an important aspect a method of illuminating a field of view for use with a vision system as described. The method is shown schematically in FIG. 8 and includes the step of providing 802 a pattern of illumination, as described above, having one or more generally elongated light interfaces. The pattern may be parallel straight lines (or a single line) or concentric circles, or discontinuous dots, or any other pattern that provides an interface that can be followed by the motion of the light pattern.

Once provided, the pattern is caused to move 804 through an angle over the field of view, to such an extent that the speckle is reduced and the illumination is still sufficient for the imaging purposes. The motion may be continuous, in the same direction, or may oscillate back and forth in opposite directions. Simultaneously with the step of moving the pattern, an image capture device is trained upon the projected pattern, and records it or uses it as the system requires.

The invention may be used in conjunction with any imaging apparatus that uses a light interface as a marker. The light source may be monochromatic, or multi-chromatic.

The foregoing discussion should be understood as illustrative and should not be considered to be limiting in any sense. While this invention has been particularly shown and described with references to preferred embodiments thereof, it will be understood by those skilled in the art that various changes in form and details may be made therein without departing from the spirit and scope of the invention as defined by the claims.

Having described the invention, what is claimed is:

1. An illuminating apparatus for use with a visual sensory apparatus, for projecting a light pattern onto a surface to be viewed by said sensory apparatus, said surface having a characteristic roughness, said illuminating apparatus comprising:

a. a light source;

b. means for constraining light emitted from said source to produce on said surface, a light pattern having a light interface, said interface having an extended dimension; and c. means for causing said light pattern to move relative to said surface, parallel to said extended dimension of said light interface.

9

2. The illuminating apparatus of claim 1, said visual sensory apparatus having a characteristic exposure interval, said means for causing said light pattern to move comprising means for causing a locus of said light pattern to move a sufficient distance relative to the surface during an exposure interval so as to reduce the degree of appearance of any interference speckle, as compared to the degree of appearance of speckle that would arise without relative motion between the light pattern and the surface.

3. The illuminating apparatus of claim 1 said light pattern comprising a plurality of extended straight line interfaces, each interface being parallel to the other interfaces of said plurality.

4. The illuminating apparatus of claim 3, said means for causing said light pattern to move comprising means for moving said light source parallel to said plurality of straight line interfaces.

5. The illuminating apparatus of claim 3, said means for causing said light pattern to move, comprising a moving mirror, located and constrained to move such that light projected onto said mirror is reflected onto said surface and said light pattern moves across said surface parallel to said plurality of parallel straight line interfaces.

6. The illuminating apparatus of claim 3, said means for causing said light pattern to move, comprising a moving prism, located and constrained to move such that light projected onto said prism is transmitted onto said surface and said light pattern moves across said surface parallel to said plurality of parallel straight line interfaces.

7. The illuminating apparatus of claim 1, said light pattern consisting of one interface having as its extended interface dimension a straight line.

8. The illuminating apparatus of claim 3, said light pattern comprising a relatively lighter region sandwiched between two relatively darker regions.

9. The illuminating apparatus of claim 1, said light pattern comprising a plurality of concentric circular light interfaces, each having an axis that is coaxial with the axes of the remaining of said plurality of circular light interfaces.

10. The illuminating apparatus of claim 9, said means for causing said light pattern to move comprising means for rotating said light source around an axis that coincides with said axes of said plurality of concentric light interfaces.

11. The illuminating apparatus of claim 9, said means for causing said light pattern to move, comprising a moving mirror, located and constrained to move such that light projected onto said mirror is reflected onto said surface and said light pattern rotates over said surface around said axes of said plurality of concentric circular light interface.

12. The illuminating apparatus of claim 5, said mirror constrained to rotate around an axis.

13. The illuminating apparatus of claim 5, said mirror constrained to move in a reciprocating pattern around a rest position.

14. The illuminating apparatus of claim 1, said light pattern consisting of one circular light interface.

15. The illuminating apparatus of claim 9, said means for causing said light pattern to move, comprising a moving prism, located and constrained to move such that light projected onto said prism is transmitted onto said surface and said light pattern rotates over said surface around said axes of said plurality of concentric circular light interfaces.

16. An apparatus for registering the configuration of a surface extending over a portion of a viewing field, said surface having a characteristic roughness, said apparatus comprising:

a. means for projecting a light pattern onto said surface, said projection means comprising:

10 i. a light source;
ii. means for constraining light emitted from said source to produce, on said surface, a light pattern having a plurality of light interfaces spaced from each other, said light interfaces being extended and parallel to each other; and
iii. means for causing said light pattern to move relative to said surface, parallel to the extended dimension of said lighted interfaces; and b. a visual sensory apparatus that views said projected pattern of light interfaces, said sensory apparatus having a characteristic exposure interval and being located so that said projected pattern is visible to said sensory apparatus.

17. The configuration registering apparatus of claim 16, said light pattern comprising a plurality of extended straight line interfaces, each interface being parallel to the other interfaces of said plurality.

18. The configuration registering apparatus of claim 17, said means for causing said light pattern to move comprising means for moving said light source parallel to said plurality of straight line interfaces.

19. The configuration registering apparatus of claim 17, said means for causing said light pattern to move, comprising a moving mirror, located and constrained to move such that light projected onto said mirror is reflected onto said surface and said light pattern moves across said surface parallel to said plurality of parallel straight line interfaces.

20. The configuration registering apparatus of claim 17, said means for causing said light pattern to move, comprising a moving prism, located and constrained to move such that light projected onto said prism is transmitted onto said surface and said light pattern moves across said surface parallel to said plurality of parallel straight line interfaces.

21. The configuration registering apparatus of claim 16, said light pattern comprising a plurality of concentric circular light interfaces, each having an axis that is coaxial with the axes of the remaining of said plurality of circular light interfaces.

22. The configuration registering apparatus of claim 21, said means for causing said light pattern to move comprising means for rotating said light source around an axis that coincides with said axes of said plurality of concentric light interfaces.

23. The configuration registering apparatus of claim 21, said means for causing said light pattern to move, comprising a moving mirror, located and constrained to move such that light projected onto said mirror is reflected onto said surface and said light pattern rotates over said surface around said axes of said plurality of concentric circular light interface.

24. The configuration registering apparatus of claim 21, said means for causing said light pattern to move, comprising a moving prism, located and constrained to move such that light projected onto said prism is transmitted onto said surface and said light pattern rotates over said surface around said axes of said plurality of concentric circular light interface.

25. A method for projecting a light interface pattern onto a surface having a characteristic roughness, said method comprising:

a. projecting a light interface pattern onto said surface, said pattern comprising a light interface having an extended dimension; and b. causing said light interface pattern to move, relative to said surface, parallel to said extended dimension.

26. The method of claim 25, said light interface pattern comprising a plurality of light interfaces, each interface having an extended dimension that is parallel to the extended dimension of each of the other interfaces.

27. The method of claim 25, said light interface pattern comprising a plurality of light interfaces, each interface having an extended dimension that is concentric with the extended dimensions of each of the other interfaces.

28. The method of claim 26, said light interface pattern comprising a plurality of parallel, straight line light interfaces.

29. The method of claim 27, said light interface pattern comprising a plurality of concentric, circular light interfaces.

30. The method of claim 25, said step of causing said light interface pattern to move comprising the step of causing said pattern to move through a distance during a characteristic exposure interval of a machine vision apparatus for use with the projecting method such that interference speckle is reduced as compared to the speckle that would arise without motion of the pattern relative to the surface.

31. The method of claim 25, said step of causing said light interface pattern to move comprising the step of moving a light source that generates said light pattern.

32. The method of claim 25, said step of causing said light interface pattern to move comprising the step of projecting said interface pattern onto a moving mirror, and reflecting said pattern from said moving mirror to said surface, such that said light interface pattern moves parallel to said extended dimension.

33. The method of claim 25, said step of causing said light interface pattern to move comprising the step of projecting said interface pattern onto a moving prism, and refracting said pattern from said moving prism to said surface, such that said light interface pattern moves parallel to said extended dimension.

* * * * *